United States Patent
Ning et al.

(10) Patent No.: US 9,698,165 B2
(45) Date of Patent: Jul. 4, 2017

(54) ARRAY SUBSTRATE, METHOD FOR MANUFACTURING THE SAME, AND DISPLAY DEVICE COMPRISING ARRAY SUBSTRATE

(71) Applicant: BOE TECHNOLOGY GROUP CO., LTD., Beijing (CN)

(72) Inventors: Ce Ning, Beijing (CN); Tao Gao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 86 days.

(21) Appl. No.: 14/359,645

(22) PCT Filed: Oct. 18, 2013

(86) PCT No.: PCT/CN2013/085511
§ 371 (c)(1),
(2) Date: May 21, 2014

(87) PCT Pub. No.: WO2014/176877
PCT Pub. Date: Nov. 6, 2014

(65) Prior Publication Data
US 2015/0303221 A1    Oct. 22, 2015

(30) Foreign Application Priority Data
Apr. 28, 2013  (CN) .......................... 2013 1 0155747

(51) Int. Cl.
*H01L 27/12* (2006.01)
*H01L 29/45* (2006.01)
*H01L 29/786* (2006.01)

(52) U.S. Cl.
CPC ........ *H01L 27/1225* (2013.01); *H01L 27/124* (2013.01); *H01L 27/127* (2013.01);
(Continued)

(58) Field of Classification Search
CPC ... H01L 27/32–27/326; H01L 51/50–51/5287;
(Continued)

(56) References Cited

U.S. PATENT DOCUMENTS

2007/0045627 A1* 3/2007 Park .................... H01L 27/1214
257/66
2009/0061571 A1* 3/2009 Li ..................... G02F 1/136213
438/155
(Continued)

FOREIGN PATENT DOCUMENTS

CN    102651341 A    8/2012
CN    102709239 U    10/2012
(Continued)

OTHER PUBLICATIONS

International Search Report mailed Feb. 6, 2014; PCT/CN2013/085511.
(Continued)

*Primary Examiner* — Earl Taylor
*Assistant Examiner* — Samuel Park
(74) *Attorney, Agent, or Firm* — Ladas & Parry LLP

(57) ABSTRACT

An embodiment of the disclosure provides an array substrate comprising: a base substrate, an active layer and a transparent electrode disposed on the base substrate, an etch stop layer disposed on the active layer and configured for protecting a portion of the active layer, wherein the active layer, the transparent electrode and the etch stop layer are formed through one patterning process and one doping process, the doped region and the first transparent electrode are made of same material and are disposed on the same layer.

11 Claims, 4 Drawing Sheets

(52) U.S. Cl.
CPC ...... *H01L 27/1255* (2013.01); *H01L 27/1288* (2013.01); *H01L 29/45* (2013.01); *H01L 29/7869* (2013.01)

(58) Field of Classification Search
CPC ............... H01L 2227/32–2227/326; H01L 2251/5323–2251/5361; H01L 2924/12044; H01L 2021/775; H01L 27/1214; H01L 27/3232; H01L 51/0076; H01L 27/14603; H01L 27/14605; H01L 27/14609; H01L 27/14812; H01L 27/3248
USPC .. 257/79–103, 40, 59, 72, E51.001, E51.01; 438/99
See application file for complete search history.

(56) References Cited

U.S. PATENT DOCUMENTS

| | | | |
|---|---|---|---|
| 2011/0127519 A1* | 6/2011 | Kang ................ | H01L 27/3244 257/43 |
| 2011/0205198 A1* | 8/2011 | Jeong ................ | H01L 27/326 345/205 |
| 2012/0049197 A1 | 3/2012 | Hsieh et al. | |
| 2013/0302939 A1 | 11/2013 | Liu et al. | |
| 2014/0061635 A1 | 3/2014 | Liu | |
| 2014/0167031 A1 | 6/2014 | Choi et al. | |
| 2014/0197415 A1* | 7/2014 | You ................ | H01L 27/124 257/59 |

FOREIGN PATENT DOCUMENTS

| | | |
|---|---|---|
| CN | 102790012 A | 11/2012 |
| CN | 103021939 A | 4/2013 |
| CN | 103258827 A | 8/2013 |
| CN | 203179888 U | 9/2013 |
| KR | 20030077372 A | 10/2003 |

OTHER PUBLICATIONS

Written Opinion of the International Searching Authority mailed Feb. 6, 2014; PCT/CN2013/085511.
Second Chinese Office Action mailed Aug. 5, 2015; Appln. No. 201310155747.X.
Korean Office Action dated Aug. 21, 2015; Appln. No. 10-2014-7016063.
First Office Action (Chinese language) from the State Intellectual Property Office of the People's Republic of China for Application No. 201310155747.X, issued on Mar. 18, 2015; 10 pages.
English Translation of First Office Action from the State Intellectual Property Office of the People's Republic of China for Application No. 201310155747.X, issued on Mar. 18, 2015; 10 pages.
English Abstract of CN103021939A; 1 page.
English Abstract of CN102709239A; 1 page.
English Abstract of CN102790012A; 1 page.
English Abstract of KR20030077382A; 1 page.
International Search Report for International Application No. PCT/CN2013/085511, twelve (12) pages.
English abstract for CN103258827A; one (1) page.
English abstract for CN203179888U; one (1) page.
English abstract for CN102651341A; one (1) page.
Extended European Search Report dated Nov. 9, 2016; Appln. No. 13854193.3-1504/2993698 PCT CN2013085511.

\* cited by examiner

ARRAY SUBSTRATE, METHOD FOR MANUFACTURING THE SAME, AND DISPLAY DEVICE COMPRISING ARRAY SUBSTRATE

CROSS REFERENCE TO RELATED APPLICATIONS

This application is based on International Application No. PCT/CN2013/085511 filed on Oct. 18, 2013, which claims priority to Chinese National Application No. 201310155747.X filed on Apr. 28, 2013. The entire contents of each and every foregoing application are incorporated herein by reference.

TECHNICAL FIELD

Embodiments of the present disclosure relate to an array substrate and a method for manufacturing the same, and further relate to a display device comprising the array substrate.

BACKGROUND

With continuous development of display technology, customers' demands for display devices are unceasingly increased. Thin film transistor-liquid crystal display is widely used in electronic products, such as a cell phone, a liquid crystal display, a tablet PC and the like. Furthermore, with wide application of display devices, the demands for color quality, contrast, viewing angles, response speed, low power consumption of a display device is rising. Accordingly, an organic light-emitting diode (OLED) display device has attracted a great deal of attention.

In conventional techniques, it usually takes 6 to 8 lithography masking processes to manufacture an array substrate. Therefore, it spends a long time on research & development and mass production, and the array substrate is costly.

SUMMARY

Embodiments of the disclosure provide an array substrate, a method for manufacturing the array substrate, and a display device comprising the array substrate, capable of reducing times of lithography masking processes for manufacturing an array substrate, saving time on research & development and mass production and decreasing manufacturing cost.

In order to achieve the above purpose, an embodiment of the disclosure provides an array substrate comprising:

a base substrate;

an active layer and a first transparent electrode disposed on the base substrate;

an etch stop layer disposed on the active layer, the etch stop layer configured for protecting a portion of the active layer;

wherein the active layer, the first transparent electrode and the etch stop layer are formed through one patterning process and one doping process, the active layer and the first transparent electrode have a same base material and are disposed on the same layer.

The array substrate further comprises a source electrode and a drain electrode, wherein the source electrode and the drain electrode are disposed above a doped region of the active layer. A transparent conductive material is disposed between the source/drain electrode and the doped region, and the source electrode and the drain electrode are electrically connected to the doped region through the transparent conductive material.

The array substrate further comprises:

a gate insulating layer disposed on the active layer, the etch stop layer and the first transparent electrode;

a gate electrode disposed on the gate insulating layer and above the active layer;

a protection layer disposed on the gate electrode and the insulating layer;

a via hole disposed above the active layer, the source electrode and the drain electrode are electrically connected to the doped region of the active layer through the via hole.

The array substrate further comprises a second transparent electrode, which is a slit-shaped electrode and disposed on the protection layer, the second transparent electrode having a same material as the transparent conductive material.

The second transparent electrode has a thickness in a range of 30 nm to 50 nm.

Any one of the active layer and the first transparent conductive electrode has a thickness in a range of 30 nm to 50 nm, and the etch stop layer has a thickness in a range of 100 nm to 200 nm.

The array substrate further comprises a buffer layer disposed between the base substrate and the active layer.

An embodiment of the disclosure further provides a display device comprising an array substrate having any one of the characteristics as described above.

An embodiment of the disclosure further provides a method for manufacturing an array substrate, comprising:

a step of forming an oxide semiconductor film and an insulation film on a base substrate;

a step of treating the oxide semiconductor film and the insulation film with one patterning process and one doping process so as to form an active layer, a first transparent electrode, and an etch stop layer disposed on the active layer and configured for protecting a region of the active layer between the doped regions.

A base material for forming the active layer is same as that of the first transparent electrode.

The step of treating the oxide semiconductor film and the insulation film with one patterning process and one doping process so as to form an active layer, a first transparent electrode, and an etch stop layer disposed on the active layer and configured for protecting a region of the active layer between the doped regions comprises:

a step of forming a first photoresist on the insulation film;

a step of semi-exposing and developing the first photoresist so as to form a completely reserved region of the first photoresist, a partially reserved region of the first photoresist and a completely removed region of the first photoresist, the completely reserved region of the first photoresist corresponding to an etch stop layer, and the partially reserved region of the first photoresist corresponding to the doped regions of the active layer and the first transparent electrode;

a step of etching the insulation film and the oxide semiconductor film corresponding to the completely removed region of the first photoresist;

a step of removing the first photoresist in a partially reserved region of the first photoresist;

a step of etching the insulation film corresponding to the partially reserved region of the first photoresist and removing the photoresist in the completely reserved region of the first photoresist, so as to form an etch stop layer; and a step of converting the oxide semiconductor film corresponding to the partially reserved region of the first photoresist into the doped regions of the active layer and a first electrode, respectively, through a doping process.

The oxide semiconductor film is treated by the doping process utilizing H, Al, Sn or Ti ions.

Any one of the active layer and the first transparent electrode has a thickness in a range of 30 nm to 50 nm, and the etch stop layer has a thickness in a range of 100 nm to 200 nm.

Before the step of forming an oxide semiconductor film and an insulation film on a base substrate, the method further comprises a step of forming a buffer layer on the base substrate.

After the step of forming the active layer, the first transparent electrode, and the etch stop layer disposed on the active layer and configured for protecting a region of the active layer between the doped regions, the method further comprises:

a step of forming a gate insulating layer above the active layer, the etch stop layer and the first transparent conductive electrode;

a step of forming a gate film on the gate insulating layer;

a step of treating the gate film through a patterning process so as to form a gate above the active layer.

After the step of forming a gate, the method further comprises:

a step of forming a protection layer above the gate and the gate insulating layer;

a step of forming a via hole above the doped regions of the active layer through one patterning process.

After the step of forming a via hole, the method further comprises:

a step of forming a transparent conductive film and a metal film on the protection layer; and a step of treating the transparent conductive film and the metal film through a patterning process so as to form a source electrode, a drain electrode and a second transparent electrode.

The step of treating the transparent conductive film and the metal film through a patterning process so as to form a source electrode, a drain electrode and a second transparent electrode comprises:

a step of forming a second photoresist on the metal film;

a step of semi-exposing and developing the second photoresist so as to form a completely reserved region of the second photoresist, a partially reserved region of the second photoresist and a completely removed region of the second photoresist, the completely reserved region of the second photoresist corresponding to a region for forming the source electrode and the drain electrode, the partially reserved region of the second photoresist corresponding to a region for forming the second transparent electrode;

a step of etching the metal film and the transparent conductive film corresponding to the completely removed region of the second photoresist;

a step of etching the second photoresist in the partially reserved region of the second photoresist;

a step of etching the metal film corresponding to the partially reserved region of the second photoresist so as to form the second transparent electrode;

a step of removing the photoresist in the completely reserved region of the second photoresist so as to form the source electrode and the drain electrode, the source electrode and the drain electrode connected to the doped regions of the active layer through the transparent conductive film, the transparent conductive film has a material as same as that of the second transparent electrode.

The second transparent electrode has a thickness in a range of 30 nm to 50 nm.

Embodiments of the disclosure provide an array substrate, a method for manufacturing the array substrate, and a display device comprising the array substrate. The array substrate comprises, a base substrate; an active layer and a first transparent electrode disposed on the base substrate; doped regions and an etch stop layer on the active layer, the etch stop layer configured for protecting a region of the active layer between the doped regions; a source electrode and a drain electrode disposed on the active layer, a transparent conductive material disposed between the source/drain electrode and the active layer, the source electrode and the drain electrode electrically connected to the doped region of the active layer through the transparent conductive material, wherein the active layer, the first transparent electrode and the etch stop layer are formed through one patterning process and one doping process, the doped regions of the active layer has a same material as the first transparent electrode. Compared to conventional techniques, the technical solution reduces times of patterning processes needed for manufacturing TFT, saves time on research and development and mass production, and decreases the manufacturing cost, as the active layer, the first transparent electrode and the etch stop layer are formed through one patterning process and one doping process.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiment will be described in a clearly and fully understandable way in connection with the drawings related to the embodiments of the disclosure. It is obvious that the described embodiments are just a part but not all of the embodiments of the disclosure. Based on the described embodiments herein, those skilled in the art can obtain other embodiment(s), without any inventive work, which should be within the scope of the disclosure.

It should be noted that, the terms "on" or "above" and "under" or "below" used herein is to describe relative position relationships of related components so as to facilitate describing embodiments of the disclosure by referring to accompanying drawings, and should not construed as a limit to the protection scope of the disclosure.

An embodiment of the disclosure provide an array substrate comprising:

a base substrate;

an active layer and a first transparent electrode disposed on the base substrate;

a doped region and an etch stop layer disposed on the active layer, the etch stop layer configured for protecting a portion of the active layer;

source/drain electrodes disposed above the active layer, wherein a transparent conductive material is disposed between the active layer and the source/drain electrodes, and the source/drain electrodes are connected to the doped region of the active layer through the transparent conductive material;

wherein the active layer, the first transparent electrode and the etch stop layer are formed through one patterning process and one doping process, material of the doped region of the active layer is same as that of the first transparent electrode.

Figure 1:
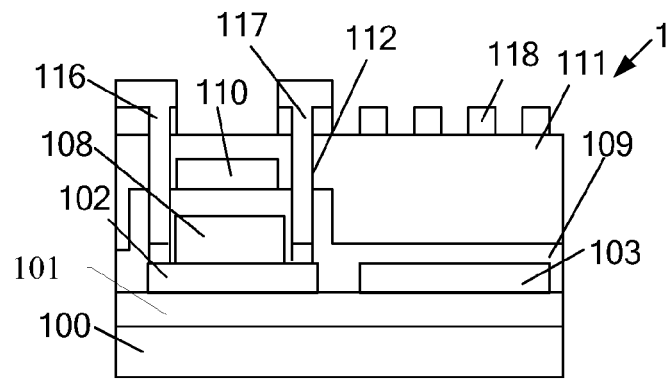
FIG. 1 is a schematic structural view of an array substrate according to an embodiment of the disclosure.

As illustrated in FIG. 1, an array substrate 1 according to one embodiment of the disclosure comprises:

a base substrate 100;

a buffer layer 101 disposed on the base substrate 100;

an active layer 102 and a first transparent electrode 103, disposed on the buffer layer 101;

a doped region on the active layer 102 and an etch stop layer 108 disposed above the active layer 102, the etch stop layer configured for protecting a portion of the active layer;

a source electrode 116 and a drain electrode 117, disposed on the active layer 102, a transparent conductive material disposed between the source/drain electrodes 116, 117 and the active layer 102, the source electrode 116 and the drain electrode 117 electrically connected to the doped region of the active layer 102 through the transparent conductive material;

a gate insulation layer 109, disposed on above the active layer 102, the etch stop layer 108 and the first transparent electrode 103;

a gate electrode 110, disposed on the gate insulation layer 109 and above the active layer 102;

a protection layer 111, disposed on the gate electrode 110 and the gate insulation layer 109;

a via hole 112 disposed above the active layer 102, the source electrode 116 and the drain electrode 117 electrically connected to the doped region of the active layer 102 through the via hole 112; and a second transparent electrode 118 disposed on the protection layer 111, the second transparent electrode 118 being a slit electrode, wherein material of the transparent second electrode 118 is same as the transparent conductive material between the source/drain electrodes 116, 117 and the active layer 102.

This embodiment is described by taking a case in which the first transparent electrode is a common electrode and the second transparent electrode is a pixel electrode as an example.

A buffer layer is optionally formed on the base substrate so as to prevent impurity in the base substrate from affecting the active layer. A buffer layer is formed on the base substrate in this embodiment.

Further, the second transparent electrode has a thickness in a range of 30 nm to 50 nm.

Further, any one of the active layer and the first transparent electrode has a thickness in a range of 30 nm to 50 nm, and the etch stop layer has a thickness in a range of 100 nm to 200 nm.

The array substrate according to this embodiment of the disclosure comprises, a base substrate; an active layer and a first transparent electrode disposed on the base substrate; doped regions and an etch stop layer on the active layer, the etch stop layer configured for protecting a region of the active layer between the doped regions; a source electrode and a drain electrode disposed on the active layer, a transparent conductive material disposed between the source/drain electrodes and the active layer, the source electrode and the drain electrode electrically connected to the doped region of the active layer through the transparent conductive material, wherein the active layer, the first transparent electrode and the etch stop layer are formed through one patterning process and one doping process, the doped region of the active layer has a same material as the first transparent electrode. Compared to conventional techniques, the technical solution reduces times of patterning processes needed for manufacturing TFT, saves time on research and development and mass production, and decreases the manufacturing cost, as the active layer, the first transparent electrode and the etch stop layer are formed through one patterning process and one doping process.

An embodiment of the disclosure provides a method for manufacturing an array substrate, comprising:

a step of forming an oxide semiconductor film and an insulation film on a base substrate;

a step of treating the oxide semiconductor film and the insulation film through one patterning process and one doping process so as to form an active layer and a first transparent electrode, and to form an etch stop layer on the active layer and configured for protecting a region of the active layer, wherein material for forming the active layer being same as material for forming the first transparent electrode.

The step of treating the oxide semiconductor film and the insulation film through one patterning process and one doping process so as to form an active layer, a first transparent electrode and an etch stop layer comprises:

forming a first photoresist on the insulation film;

semi-exposing and developing the first photoresist, so as to form a completely reserved region of the first photoresist, a partially reserved region of the first photoresist and a completely removed region of the first photoresist, the completely reserved region of the first photoresist corresponding to a region of the active layer to be protected, the partially reserved region of the first photoresist corresponding to a region of the active layer for forming a doped region and the first transparent electrode;

etching the insulation layer and the oxide semiconductor film corresponding to the completely removed region of the first photoresist;

removing photoresist in the partially reserved region of the first photoresist;

etching the insulation film corresponding to the partially reserved region of the first photoresist, and removing photoresist in the completely reserved region of the first photoresist so as to form the etch stop layer;

converting the oxide semiconductor film corresponding to the partially reserved region of the first photoresist into a doped region of the active layer and the first transparent electrode, respectively, by means of a doping process;

An embodiment of the disclosure provides a method for manufacturing an array substrate, the method comprising the following steps:

Step S101, depositing a buffer layer on a base substrate.

Figure 2:
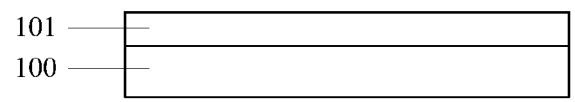
FIG. 2 is a schematic structural view of an array substrate according to an embodiment of the disclosure after step S101.

As illustrated in FIG. 2, a buffer layer 101 is formed on a pre-cleaned base substrate 100 so as to prevent impurities included in the base substrate 100 from diffusing into an active layer and avoid impacts on properties of TFT such as threshold voltage, leakage current and the like. The buffer layer 101 can be formed through plasma enhanced chemical vapor deposition (PECVD) method, low pressure chemical vapor deposition (LPCVD) method, atmospheric pressure chemical vapor deposition (APCVD) method, electron cyclotron resonance-chemical vapor deposition (ECR-CVD) method or sputtering and the like.

It should be explained that, material of the buffer layer 101 may be at least one of silicon oxide and silicon nitride. That is, the buffer layer 101 can be a single layer of silicon oxide, a single layer of silicon nitride, or a laminated layer of the both.

Further, the buffer layer 101 has a thickness in a range of 100 nm to 300 nm.

It should be noted that, an alkali free glass substrate can be selected as the base substrate 101, as content of metal impurities, such as aluminum, barium, sodium, in conventional alkali glass is high and metal impurities tends to diffuse during a high-temperature treatment.

It should be explained that, a buffer layer can be optionally formed on the base substrate so as to prevent the active layer from being affected by impurities in the glass base substrate. A buffer layer is formed on the base substrate in this embodiment.

Step S102: forming an active layer, a first transparent electrode and an etch stop layer on the buffer layer.

The active layer has a base material as same as that of the first transparent conductive layer. The base material refers to materials for forming the active layer and the first transparent electrode by doping.

Exemplarily, step S102 of forming an active layer, a first transparent electrode and an etch stop layer on the buffer layer can comprise step S201 to step S208.

Step S201, forming an oxide semiconductor film on the buffer layer. The oxide semiconductor film is a base material for the buffer layer and the first transparent electrode, and may be indium gallium zinc oxide (IGZO), $In_2O_3$, ZnO or indium tin zinc oxide (ITZO) and the like.

Step S202, forming an insulation film on the oxide semiconductor film.

Figure 3:
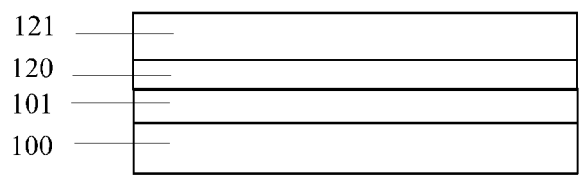
FIG. 3 is a schematic structural view of an array substrate according to an embodiment of the disclosure after step S202.

As illustrated in FIG. 3, an oxide semiconductor film and an insulation film are deposited on the buffer layer 101, and a method for depositing the oxide semiconductor film and the insulation film can be PECVD, LPCVD, APCVD, ECR-CVD, sputtering or the like. It is not limited in embodiments of the disclosure.

The oxide semiconductor film has a thickness in a range of 30 nm to 50 nm, and the insulation film has a thickness in a range of 100 nm to 200 nm.

Step S203, forming a first photoresist on the insulation film.

Step S204, semi-exposing and developing the first photoresist so as to form a completely reserved region of the first photoresist, a partially reserved region of the first photoresist and a completely removed region of the first photoresist, the completely reserved region of the first photoresist corresponding to an etch stop layer, and the partially reserved region of the first photoresist corresponding to a region of the active layer for forming a doped region and the first transparent electrode.

Figure 4:
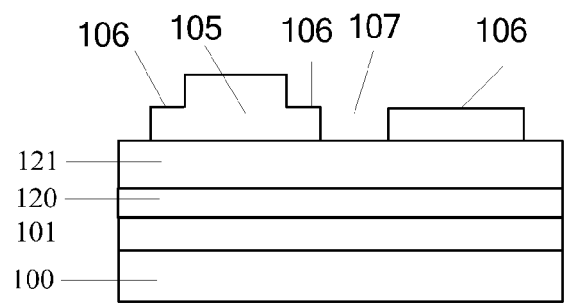
FIG. 4 is a schematic structural view of an array substrate according to an embodiment of the disclosure after step S204.

As illustrated in FIG. 4, the first photoresist is semi-exposed and developed so as to form a completely reserved region 105 of the first photoresist, a partially reserved region 106 of the first photoresist and a completely removed region 107 of the first photoresist.

Step S205, etching the insulation film and the oxide semiconductor film corresponding to the completely removed region of the first photoresist.

Figure 5:
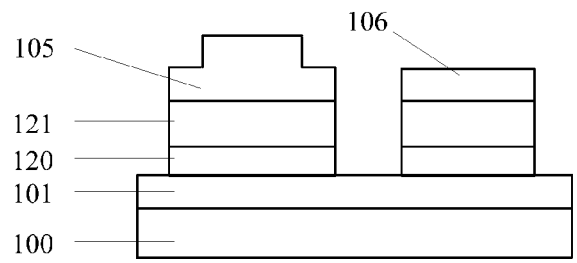
FIG. 5 is a schematic structural view of an array substrate according to an embodiment of the disclosure after step S205.

For example, the insulation film corresponding to the completely removed region of the first photoresist is etched by a dry etching, and the oxide semiconductor film corresponding to the completely removed region of the first photoresist is etched by a wet etching. Thus, a structure as illustrated in FIG. 5 can be formed.

Step S206, removing the first photoresist in the partially reserved region of the first photoresist.

For example, the first photoresist in the partially reserved region of the first photoresist is removed by ashing, and at the same time, thickness of the first photoresist in the completely reserved region of the first photoresist is reduced.

Step S207, etching the insulation film corresponding to the partially reserved region of the first photoresist and removing the photoresist in the completely reserved region of the first photoresist, so as to form the etch stop layer.

Figure 6:
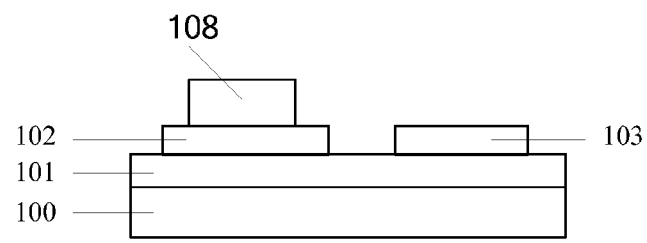
FIG. 6 is a schematic structural view of an array substrate according to an embodiment of the disclosure after step S207.

As illustrated in FIG. 6, the insulation film corresponding to the partially reserved region of the first photoresist is etched by a dry etching and the photoresist in the completely reserved region of the first photoresist is removed, so as to form the etch stop layer 108.

Step S208, converting the oxide semiconductor film corresponding to the partially reserved region of the first photoresist into a doped region of the active layer and a first transparent electrode, respectively, by a doping process.

For example, a doping process is performed by treating the oxide semiconductor film by utilizing H, Al, Sn or Ti ion.

Alternatively, step S208 can be performed simultaneously with step S207. That is, while forming the etch stop layer, the oxide semiconductor film corresponding to the partially reserved region of the first photoresist is doped by utilizing plasma of a dry etching, such that the oxide semiconductor film corresponding to the partially reserved region of the first photoresist is converted into a doped region of the active layer and the first transparent electrode.

Or, step S208 may also be performed after step S207. In this case, the oxide semiconductor film can be converted into the doped region of the active layer and the first transparent electrode, respectively, by utilizing individual H plasma, or, the oxide semiconductor film is converted into the doped region of the active layer and the first transparent electrode, respectively, by means of ion implantation using Al, Sn or Ti ion.

A region of the active layer is treated by a doping process such that the region can be kept in good contact with the source electrode and the drain electrode in order to reduce contact resistance when forming the source electrode and the drain electrode.

Step S103, forming a gate insulating layer on the buffer layer 101, the active layer 102, the first transparent electrode 103 and the etch stop layer 108.

Figure 7:
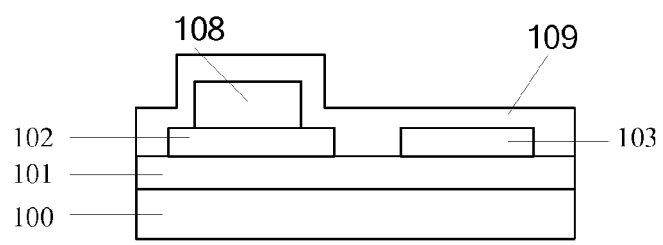
FIG. 7 is a schematic structural view of an array substrate according to an embodiment of the disclosure after step S103.

As illustrated in FIG. 7, a gate insulating layer 109 is formed on the buffer layer 101, the active layer 102, the first transparent electrode 103 and the etch stop layer 108 by means of PECVD, LPCVD, APCVD, ECR-CVD, or sputtering and the like.

A thickness of the gate insulating layer 109 can be adaptively altered according to actual designs of the array substrate. For example, the gate insulating layer 109 has a thickness in a range of 50 nm to 200 nm Materials for the gate insulating layer 109 can be at least one of silicon oxide and silicon nitride. That is, the gate insulating layer 109 can be a single layer of silicon oxide, a single layer of silicon nitride, or a laminated layer of the both.

Step S104, forming a gate film on the gate insulating layer.

For example, a gate film can be formed on the gate insulating layer by means of PECVD, LPCVD, APCVD, ECR-CVD, or sputtering and the like. The gate film has a thickness in a range of 200 nm to 300 nm.

Step S105, treating the gate film by a patterning process so as to form a gate above the active layer.

Figure 8:
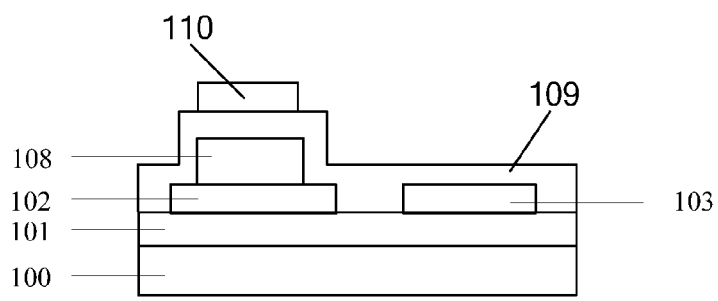
FIG. 8 is a schematic structural view of an array substrate according to an embodiment of the disclosure after step S105.

As illustrated in FIG. 8, after treating the gate film by a patterning process, a gate 110 is formed above the active layer 102. A patterning process may comprise steps of coating photoresist, exposing, developing, etching, removing photoresist and the like. Dry etchings such as plasma etching, reactive ion etching, inductively coupled plasma etching and the like can be selected as the etching process. Etching gases can be a gas containing F or Cl, such as $CF_4$, $CHF_3$, $SF_6$ and $CCl_2F_2$. The etching gases can also be a mixture of one or more of the gases mentioned above with $O_2$.

Step S106, forming a protection layer on the gate 110 and the gate insulating layer 109.

Figure 9:
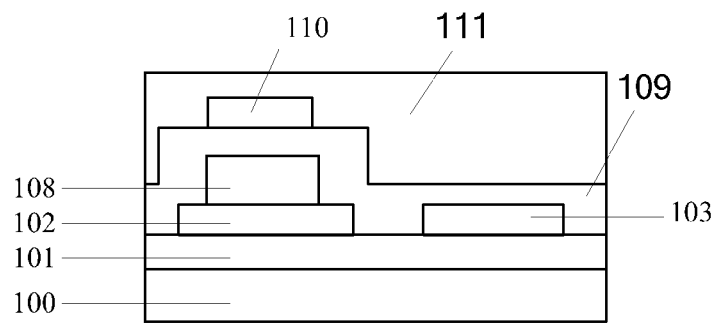
FIG. 9 is a schematic structural view of an array substrate according to an embodiment of the disclosure after step S106.

A protection layer 111 is formed on the gate 110 and the gate insulating layer 109 by means of PECVD, LPCVD, APCVD, ECR-CVD, or sputtering and the like. Thus, a structure as illustrated in FIG. 9 can be formed.

A thickness of the protection layer 111 can be adaptively altered according to actual designs of the array substrate. For example, the protection layer 111 has a thickness in a range of 200 nm to 400 nm.

Step S107, forming a via hole above the active layer through a patterning process.

Figure 10:
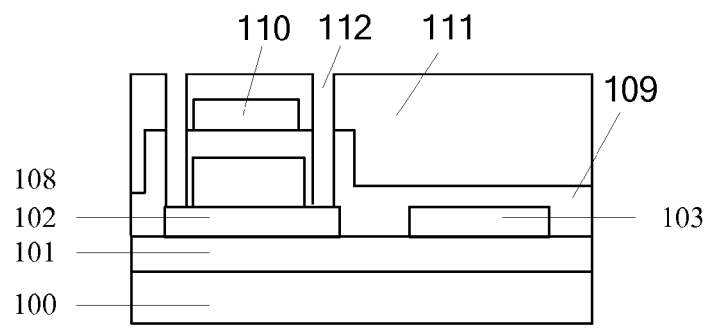
FIG. 10 is a schematic structural view of an array substrate according to an embodiment of the disclosure after step S107.

As illustrated in FIG. 10, after forming the protection layer 111, a via hole 112 is formed in the gate insulating layer 109 and the protection layer 111 (that is, above the doped region of the active layer). A method for forming the via hole can be a dry etching method such as plasma etching, reactive ion etching, inductively coupled plasma etching and the like. Etching gases can be a gas containing F or Cl, such as $CF_4$, $CHF_3$, $SF_6$ and $CCl_2F_2$. The etching gases can also be a mixture of one or more of the gases mentioned above with $O_2$.

Step S108, forming a transparent conductive film 130 on the protection layer 111.

For example, a transparent conductive film 130 is formed on the protection layer 111 by means of PECVD, LPCVD, APCVD, ECR-CVD, or sputtering and the like. The transparent conductive film 130 has a thickness in a range of 30 nm to 50 nm.

Step S109, forming a metal film 131 on the transparent conductive film.

For example, a metal film 131 is formed on the transparent conductive film by means of PECVD, LPCVD, APCVD, ECR-CVD, or sputtering and the like. The metal film 131 has a thickness in a range of 200 nm to 300 nm.

Step S110, treating the transparent conductive film 130 and the metal film 131 through one patterning process, so as to form a source electrode 116, a drain electrode 117 and a second transparent electrode 118.

Exemplarily, step S110 of forming a source electrode 116, a drain electrode 117 and a second transparent electrode 118 may comprise step S301 to step S305.

Step S301, forming a second photoresist on the metal film.

Step S302, semi-exposing and developing the second photoresist so as to form a completely reserved region of the second photoresist, a partially reserved region of the second photoresist and a completely removed region of the second photoresist, the completely reserved region of the second photoresist corresponding to a region for forming the source electrode 116 and the drain electrode 117, the partially reserved region of the second photoresist corresponding to a region for forming a second transparent electrode 118.

Figure 11:
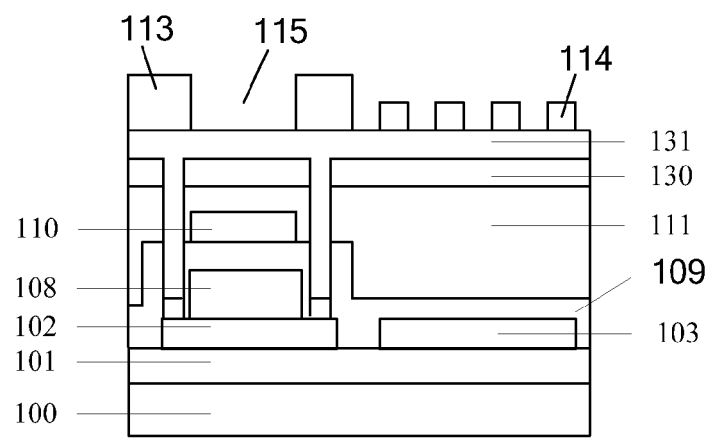
FIG. 11 is a schematic structural view of an array substrate according to an embodiment of the disclosure after step S302.

As illustrated in FIG. 11, the second photoresist formed on the metal film 131 is semi-exposed and developed so as to form a completely reserved region 113 of the second photoresist, a partially reserved region 114 of the second photoresist and a completely removed region 115 of the second photoresist.

Step S303, etching the metal film and the transparent conductive film corresponding to the completely removed region 115 of the second photoresist.

Figure 12:
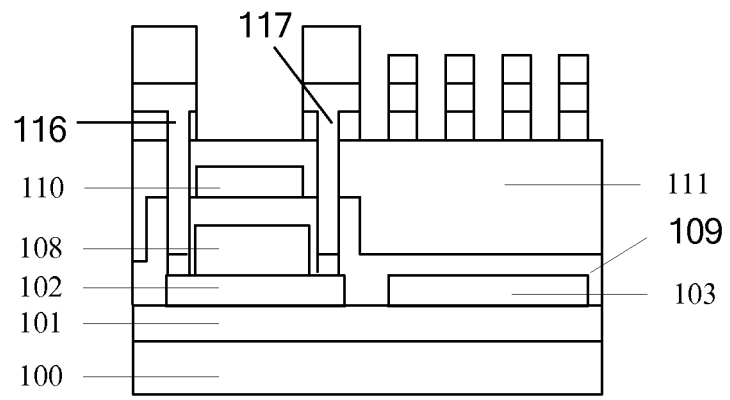
FIG. 12 is a schematic structural view of an array substrate according to an embodiment of the disclosure after step S303.

For example, as illustrated in FIG. 12, the metal film 131 and the transparent conductive film 130 corresponding to the completely removed region 115 of the second photoresist are etched through one wet etching, so as to form a source electrode 116 and a drain electrode 117.

Step S304, removing the second photoresist in the partially reserved region 114 of the second photoresist.

For example, the second photoresist in the partially reserved region 114 of the second photoresist is removed by ashing, and at the same time, a thickness of the second photoresist in the completely reserved region of the second photoresist 113 is reduced.

Step S305, etching the metal film 131 corresponding to the partially reserved region 114 of the second photoresist so as to form a second transparent electrode 118.

Figure 13:
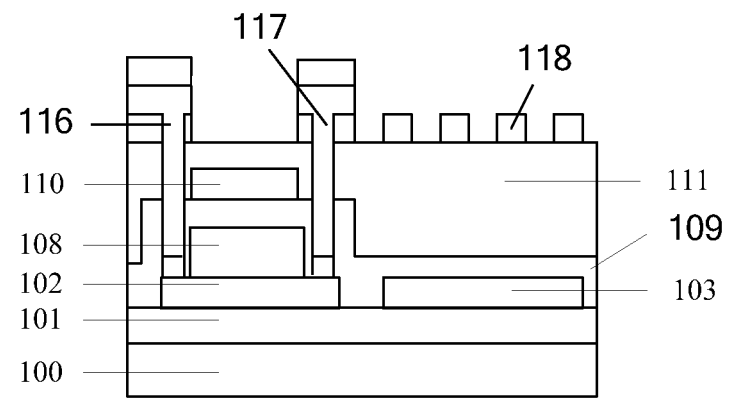
FIG. 13 is a schematic structural view of an array substrate according to an embodiment of the disclosure after step S305.

As illustrated in FIG. 13, the metal film 131 corresponding to the partially reserved region 114 of the second photoresist is etched through one wet etching, so as to form the second transparent electrode 118.

Step S306, removing the photoresist in the completely reserved region of the second photoresist so as to form a source electrode 116 and a drain electrode 117, the source electrode 116 and the drain electrode 117 are connected to the doped region of the active layer through a transparent conductive film, material of which is same as that of the second transparent electrode 118.

Further, any one of the active layer 102 and the first transparent conductive electrode 103 has a thickness in a range of 30 nm to 50 nm, and the etch stop layer has a thickness in a range of 100 nm to 200 nm.

Further, the second transparent electrode 118 has a thickness in a range of 30 nm to 50 nm.

The method for manufacturing an array substrate according to embodiments of the disclosure comprises: forming an oxide semiconductor film and an insulation film on a base substrate, treating the oxide semiconductor film and the insulation film through one patterning process and one doping process so as to form an active layer, a first transparent electrode, and forming an etch stop layer above the active layer for a region of the active layer between a source electrode and a drain electrode. Compared to conventional techniques, this solution reduces times of patterning processes needed for manufacturing TFT, saves time on research and development and mass production, and decreases the manufacturing cost, as the active layer, the first transparent electrode and the etch stop layer are formed through one patterning process and one doping process.

According to another aspect of embodiments of the disclosure, a display device is provided, which comprises the array substrate as described in any one of the above embodiments of the disclosure. The display device can be a liquid crystal device, comprising a color film substrate and an array substrate according to any one of the above embodiments, disposed parallel and opposite to each other, and liquid crystal filled between the color film substrate and the array substrate. The display device can also be an OLED display device, comprising the array substrate according to any one of the above embodiments, organic light emitting material evaporated on the array substrate, and a package cover.

The liquid crystal display device according to the embodiment of the disclosure can be any product or component that has a display function, such as a liquid crystal display, a liquid crystal TV, a digital frame, a cell phone, a tablet PC and the like. It is not limited in embodiments of the disclosure.

The foregoing is merely exemplary embodiments of the disclosure, but is not used to limit the protection scope of the disclosure. The protection scope of the disclosure is defined by the attached claims.

The invention claimed is:

1. A method for manufacturing an array substrate, the method comprising:
 a step of forming an oxide semiconductor film and an insulation film on a base substrate;
 a step of treating the oxide semiconductor film and the insulation film with one patterning process and one doping process so as to form an active layer, two doped regions of the active layer, a first transparent electrode, and an etch stop layer, the etch stop layer is disposed on the active layer and configured for protecting a region of the active layer between the doped regions; and
 after forming the active layer, the first transparent electrode, and the etch stop layer, the method further comprising:
 forming a gate insulating layer above the active layer, the etch stop layer and the first transparent electrode;
 forming a gate film on the insulating layer; and
 treating the gate film through one patterning process so as to form a gate above the active layer.

2. The method for manufacturing an array substrate according to claim 1, wherein the oxide semiconductor film comprises a base material for the active layer and the first transparent electrode; the oxide semiconductor film is IGZO, $In_2O_3$, ZnO, or ITZO.

3. The method for manufacturing an array substrate according to claim 1, wherein the step of treating the oxide semiconductor film and the insulation film with one patterning process and one doping process so as to form the active layer, two doped regions of the active layer, the first transparent electrode, and the etch stop layer comprises:
 forming a first photoresist on the insulation film:
 semi-exposing and developing the first photoresist so as to form a completely reserved region of the first photoresist, a partially reserved region of the first photoresist and a completely removed region of the first photoresist, the completely reserved region of the first photoresist corresponding to an etch stop layer, and the partially reserved region of the first photoresist corresponding to the doped regions of the active layer and the first transparent electrode;
 etching the insulation film and the oxide semiconductor film corresponding to the completely removed region of the first photoresist;
 removing the first photoresist in a partially reserved region of the first photoresist;
 etching the insulation film corresponding to the partially reserved region of the first photoresist and removing the photoresist in the completely reserved region of the first photoresist, so as to form the etch stop layer; and
 converting the oxide semiconductor film corresponding to the partially reserved region of the first photoresist into the doped regions of the active layer and a first transparent electrode, respectively, through a doping process.

4. The method for manufacturing an array substrate according to claim 1, wherein the oxide semiconductor film is treated by the doping process utilizing H, Al, Sn or Ti ions.

5. The method for manufacturing an array substrate according to claim 1, wherein any one of the active layer and the first transparent electrode has a thickness in a range of 30 nm to 50 nm, and the etch stop layer has a thickness in a range of 100 nm to 200 nm.

6. The method for manufacturing an array substrate according to claim 1, wherein before forming the oxide semiconductor film and the insulation film on the base substrate, the method further comprises:
 forming a buffer layer on the base substrate.

7. The method for manufacturing an array substrate according to claim 1, wherein, after forming the gate electrode, the method further comprises:
 a step of forming a protection layer above the gate and the gate insulating layer; and
 a step of forming a via hole above the doped regions of the active layer through one patterning process.

8. The method for manufacturing an array substrate according to claim 7, wherein, after forming the via hole, the method further comprises:
 a step of forming a transparent conductive film and a metal film on the protection layer and the via hole; and
 a step of treating the transparent conductive film and the metal film through one patterning process so as to form a source electrode, a drain electrode and a second transparent electrode.

9. The method for manufacturing an array substrate according to claim 8, wherein,
 the step of treating the transparent conductive film and the metal film through one patterning process so as to form the source electrode, the drain electrode and the second transparent electrode comprises:

a step of forming a second photoresist on the metal film;

a step of semi-exposing and developing the second photoresist so as to form a completely reserved region of the second photoresist, a partially reserved region of the second photoresist and a completely removed region of the second photoresist, the completely reserved region of the second photoresist corresponding to a region for forming the source electrode and the drain electrode, the partially reserved region of the second photoresist corresponding to a region for forming the second transparent electrode;

a step of etching the metal film and the transparent conductive film corresponding to the completely removed region of the second photoresist;

a step of etching the second photoresist in the partially reserved region of the second photoresist;

a step of etching the metal film corresponding to the partially reserved region of the second photoresist so as to form the second transparent electrode; and a step of removing the photoresist in the completely reserved region of the second photoresist so as to form the source electrode and the drain electrode, the source electrode and the drain electrode connected to the doped regions of the active layer through the transparent conductive film, the transparent conductive film has a same material as the second transparent electrode.

10. The method for manufacturing an array substrate according to claim 8, wherein the second transparent electrode has a thickness in a range of 30 nm to 50 nm.

11. The method for manufacturing an array substrate according to claim 3, wherein the oxide semiconductor film is treated by the doping process utilizing H, Al, Sn or Ti ions.

* * * * *